United States Patent
Jasim

(10) Patent No.: US 10,483,762 B2
(45) Date of Patent: Nov. 19, 2019

(54) POWER TRANSMISSION NETWORK

(71) Applicant: General Electric Technology GmbH, Baden (CH)

(72) Inventor: Omar Fadhel Jasim, Stafford (GB)

(73) Assignee: GENERAL ELECTRIC TECHNOLOGY GMBH, Baden (CH)

( * ) Notice: Subject to any disclaimer, the term of this patent is extended or adjusted under 35 U.S.C. 154(b) by 101 days.

(21) Appl. No.: 15/316,522

(22) PCT Filed: Jun. 8, 2015

(86) PCT No.: PCT/EP2015/062718
§ 371 (c)(1),
(2) Date: Dec. 6, 2016

(87) PCT Pub. No.: WO2015/189151
PCT Pub. Date: Dec. 17, 2015

(65) Prior Publication Data
US 2017/0141574 A1 May 18, 2017

(30) Foreign Application Priority Data
Jun. 9, 2014 (EP) .................................... 14275133

(51) Int. Cl.
*H02J 3/36* (2006.01)
*H02J 3/06* (2006.01)
(Continued)

(52) U.S. Cl.
CPC ............. *H02J 3/36* (2013.01); *H02J 3/06* (2013.01); *H02J 3/08* (2013.01); *H03L 7/087* (2013.01);
(Continued)

(58) Field of Classification Search
CPC ........ H02J 3/40; H02J 3/46; H02J 3/44; H02J 3/08; H02J 3/36; H02J 3/06; Y02E 60/60;
(Continued)

(56) References Cited

U.S. PATENT DOCUMENTS

2011/0074474 A1* 3/2011 Yuan ..................... H03L 7/085
327/156
2011/0075456 A1* 3/2011 Tan ......................... H02M 7/48
363/74
(Continued)

FOREIGN PATENT DOCUMENTS

CN 1175324 A 3/1998
CN 1486534 A 3/2004
(Continued)

OTHER PUBLICATIONS

Rolim, Lus Guilherme Barbosa, Diogo Rodrigues da CostaJr, and Maurcio Aredes. "Analysis and software implementation of a robust synchronizing PLL circuit based on the pq theory." IEEE Transactions on Industrial Electronics 53.6 (2006): 1919-1926. (Year: 2006).*

(Continued)

*Primary Examiner* — Ryan Johnson
(74) *Attorney, Agent, or Firm* — Eversheds Sutherland (US) LLP

(57) ABSTRACT

A power transmission network is disclosed, which includes an AC electrical network connected to a point of common coupling, the point of common coupling being connectable to a further electrical device; and a processing circuit configured to receive and process a voltage of the point of common coupling to determine a phase difference between the voltages of the AC electrical network and the point of common coupling during an exchange of power between the AC electrical network and the point of common coupling.

12 Claims, 11 Drawing Sheets

(51) Int. Cl.
*H02J 3/08* (2006.01)
*H03L 7/087* (2006.01)
*H03L 7/099* (2006.01)

(52) U.S. Cl.
CPC ........ *H03L 7/099* (2013.01); *H02J 2003/365* (2013.01); *Y02E 60/60* (2013.01)

(58) Field of Classification Search
CPC ............... Y02E 40/74; H02M 1/08; H02M 2007/53876; Y04S 10/22; Y04S 10/265; H03L 7/099; H03L 7/087
See application file for complete search history.

(56) References Cited

U.S. PATENT DOCUMENTS

| | | | |
|---|---|---|---|
| 2011/0128054 A1* | 6/2011 | Kerkman | H02J 3/08 327/156 |
| 2013/0166090 A1 | 6/2013 | Ren et al. | |

FOREIGN PATENT DOCUMENTS

| | | | |
|---|---|---|---|
| CN | 102136738 | A * | 7/2011 |
| CN | 102136738 | A | 7/2011 |
| EP | 0152595 | A1 | 8/1985 |
| EP | 2698920 | A1 | 2/2014 |

OTHER PUBLICATIONS

Machine translation and Office Action and search report issued in connection with corresponding CN Application No. 201580031136.1 dated Sep. 5, 2018.
Hsieh et al., "Phase-Locked Loop Techniques. A Survey", IEEE Transactions on Industrial Electronics, vol. No. 43, Issue No. 06, pp. 609-615, Dec. 1, 1996.
Kaura et al., "Operation of a Phase Locked Loop System Under Distorted Utility Conditions", IEEE Transactions on Industry Applications, vol. No. 33, Issue No. 01, pp. Feb. 1, 1997.
Ghartemani et al., "Non Linear Adaptive Filter for Online Signal Analysis in Power Systems: Applications", IEEE Transactions on Power Delivery, vol. No. 17, Issue No. 02, pp. Apr. 1, 2002.
Minambres et al., "Comparison of Controllers for a Three-Phase Phase Locked Loop System Under Distorted Conditions", Compatibility and Power Electronics, pp. 79-85, May 20, 2009.
Cobreces et al., "Grid Impedance Monitoring System for Distributed Power Generation Electronic Interfaces", IEEE Transactions on Instrumentation and Measurement, vol. No. 58, Issue No. 09, pp. 3112-3121, Sep. 1, 2009.
Rocabert et al., "Control of Power Converters in AC Microgrids", IEEE Transactions on Power Electronics, vol. No. 27, Issue No. 11, pp. 4734-4749, Nov. 30, 2012.
Pereira et al., "Influence of PLL in Wind Parks Harmonic Emissions", IEEE Pes Conference on Innovative Smart Grid Technologies, pp. 1-8, Apr. 1, 2013.
European Search Report and Opinion issued in connection with corresponding EP Application No. 2955812 dated Dec. 10, 2014.
PCT Search Report and Written Opinion issued in connection with corresponding PCT Application No. PCT/EP2015/062718 dated Oct. 8, 2015.
PCT Written Opinion issued in connection with corresponding PCT Application No. PCT/EP2015/062718 dated May 24, 2016.

* cited by examiner

POWER TRANSMISSION NETWORK

BACKGROUND

Embodiments of the present invention relate to a power transmission network.

In power transmission networks alternative current (AC) power is converted to direct current (DC) power for transmission via overhead lines and/or under-sea cables. This conversion to DC power removes the need to compensate for the AC capacitive load effects imposed by the power transmission medium, i.e. the transmission line or cable, and reduces the cost per kilometer of the lines and/or cables, and thus becomes cost-effective when power needs to be transmitted over a long distance. A converter, such as a voltage source converter, provides the required conversion between AC power and DC power within the power transmission network.

BRIEF DESCRIPTION

According to an aspect of the invention, there is provided a power transmission network comprising: an AC electrical network connected to a point of common coupling, the point of common coupling being connectable to a further electrical device; and a processing circuit configured to receive and process a voltage of the point of common coupling to determine a phase difference between the voltages of the AC electrical network and the point of common coupling during an exchange of power between the AC electrical network and the point of common coupling.

The inclusion of the processing circuit in the power transmission network according to an aspect of the invention enables determination of the phase difference between the voltages of the AC electrical network and the point of common coupling during an exchange of power between the AC electrical network and the point of common coupling. This in turn permits use of the phase difference to provide information about the electrical characteristics of the power transmission network in order to improve the reliability and stability of the operation of the power transmission network.

The voltages of the AC electrical network and the point of common coupling may be in-phase prior to the exchange of power between the AC electrical network and the point of common coupling. This results in a more accurate determination of the phase difference between the voltages of the AC electrical network and the point of common coupling during the exchange of power between the AC electrical network and the point of common coupling The electrical device, to which the point of common coupling is connected, may vary depending on the operating requirements of the power transmission network. For example, the point of common coupling may be connected to a converter.

An AC electrical network may include one or more sources, one or more loads and one or more power transmission lines. Thus, the network impedance of the AC electrical network not only may be difficult to determine when the AC electrical network has a complex structure, but also could vary as a result of the interaction(s) between its various components. This in turn could make it difficult to operate the converter in a manner that ensures reliable and stable operation of the power transmission network.

When the point of common coupling is connected to a converter, the processing circuit may be configured to process the phase difference in combination with the voltage and current of the point of common coupling to determine a network impedance of the AC electrical network. The processing circuit may be configured to process the network impedance to define the operating requirements of the converter, and to operate the converter in accordance with the defined operating requirements.

The configuration of the processing circuit in this manner permits accurate determination of the network impedance of the AC electrical network during the exchange of power between the AC electrical network and the point of common coupling. Furthermore such configuration of the processing circuit permits operation of the converter to be adapted to take into account any variation in the network impedance in order to ensure reliable and stable operation of the power transmission network. Otherwise not adapting the operation of the converter to take into account any variation in the network impedance could lead to undesirable consequences, such as the occurrence of an undesirable transient overcurrent or a collapse in power transfer in the power transmission network.

The defined operating requirements of the converter may vary depending on the operating conditions of the power transmission network.

For example, the processing circuit may be configured to process the network impedance to define the real and/or reactive power exchange requirements of the exchange of power between the AC electrical network and the converter, and to operate the converter in accordance with the defined real and/or reactive power exchange requirements.

The configuration of the processing circuit to define the reactive power exchange requirements of the exchange of power between the AC electrical network and the converter is particularly useful when the AC electrical network is a weak AC electrical network.

It will be appreciated that the configuration of the processing circuit according to an embodiment of the invention may vary as long as the processing circuit is capable of receiving and processing a voltage of the point of common coupling to determine a phase difference between the voltages of the AC electrical network and the point of common coupling during an exchange of real power between the AC electrical network and the point of common coupling.

In embodiments of the invention the processing circuit may be or may include a phase locked loop to receive and process the voltage of the point of common coupling to determine the phase difference between the voltages of the AC electrical network and the point of common coupling. The phase locked loop may include a cascade connection of a phase detector, a loop filter and a first voltage controlled oscillator. The output of the loop filter may be configured to provide a phase difference signal corresponding to the phase difference between the voltages of the AC electrical network and the point of common coupling.

The use of a phase locked loop permits continuous and real-time determination of the phase difference between the voltages of the AC electrical network and the point of common coupling during the exchange of real power between the AC electrical network and the point of common coupling. This ensures that the power transmission network may be operated in a reliable and stable manner when the phase difference varies greatly with time.

In such embodiments the phase locked loop may further include a second voltage controlled oscillator. The second voltage controlled oscillator may be configured to lock the phases of the voltages of the AC electrical network and the point of common coupling prior to the exchange of power between the AC electrical network and the point of common coupling. The phase locked loop may be configured to switch between the first and second voltage controlled oscillators.

The addition of the second voltage controlled oscillator to the phase locked loop not only obviates the need for a single voltage controlled oscillator to perform multiple functions, thus simplifying the structure of the phase locked loop, but also permits the design of each voltage controlled oscillator to be optimised with regard to its respective function In further embodiments of the invention the processing circuit may further include a frequency detector configured to receive and process a voltage of the point of common coupling to provide a frequency reference to the voltage controlled oscillator. The frequency detector may be or may include a frequency locked loop.

The provision of a frequency reference to the voltage controlled oscillator eliminates any error in the determined phase difference that would have been caused by a shift in frequency of the AC electrical network, thus improving the accuracy of the determined phase difference.

The frequency detector may be configured to clamp the frequency reference to correspond to a nominal frequency of the AC electrical network during the exchange of power between the AC electrical network and the point of common coupling.

In still further embodiments of the invention the phase detector may be configured to perform a transformation of the received voltage of the point of common coupling to provide a voltage vector consisting of positive and negative sequence components.

In such embodiments the loop filter may be configured to receive and process only the positive sequence component of the positive and negative sequence components of the voltage vector to determine the phase difference between the voltages of the AC electrical network and the point of common coupling during an exchange of power between the AC electrical network and the point of common coupling. Configuration of the loop filter in this manner enables determination of the phase difference during unbalanced operating conditions of the power transmission network. This is because the oscillating component associated with the negative sequence component is omitted when determining the phase difference.

BRIEF DESCRIPTION OF THE DRAWINGS

Embodiments of the invention will now be described, by way of non-limiting examples, with reference to the accompanying drawings in which.

DETAILED DESCRIPTION

Figure 1A:
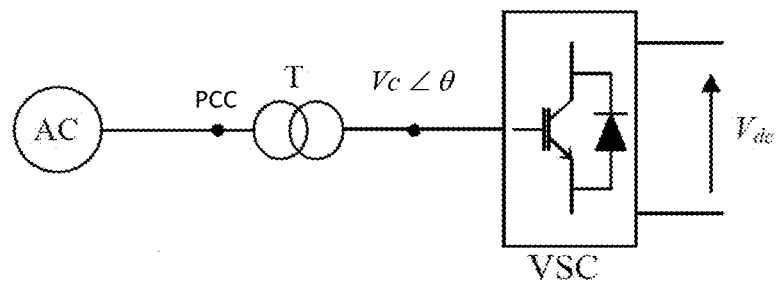
FIG. 1A shows, in schematic form, a power transmission network according to a first embodiment of the invention.

A first power transmission network according to a first embodiment of the invention is shown in FIG. 1A.

The first power transmission network includes a three-phase AC electrical network, a point of common coupling (PCC), a transformer and a converter 18.

Figure 1B:
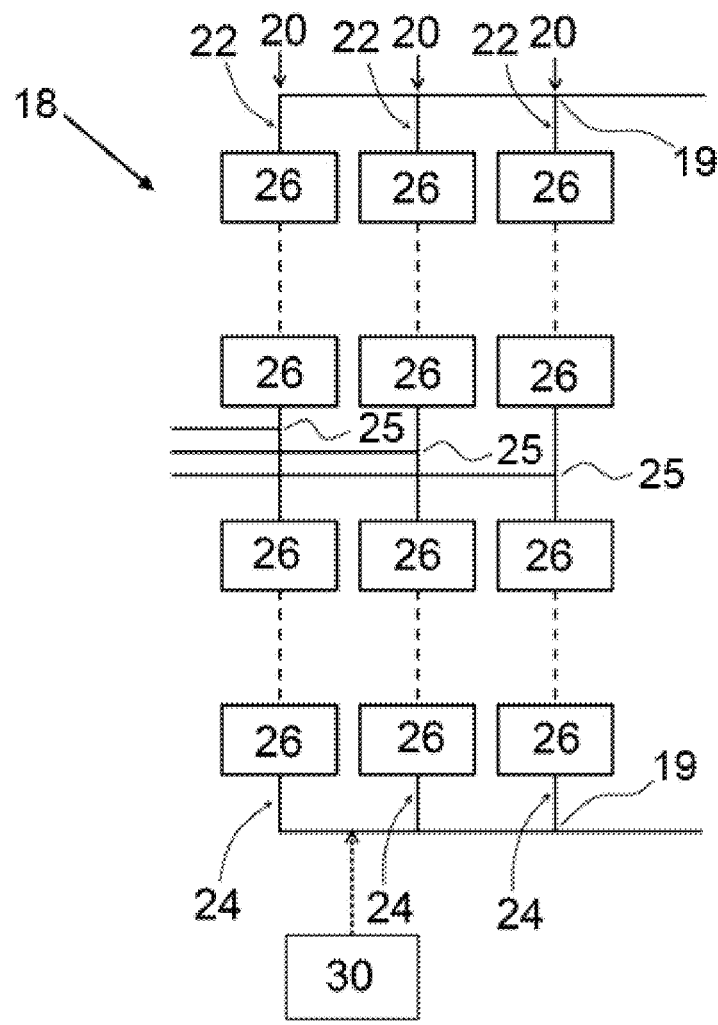
FIG. 1B shows, in schematic form, a converter of the power transmission network of FIG. 1A.

The converter 18 includes a plurality of converter limbs 20, as shown in FIG. 1B.

Each converter limb 20 extends between a pair of second electrical terminals 19. Each converter limb 20 has first and second limb portions 22,24 separated by a respective first electrical terminal 25.

Each limb portion 22,24 includes a plurality of series-connected switching elements 26. Each switching element 26 includes an active switching device that is connected in anti-parallel with a passive current check element.

Each active switching device is in the form of an insulated gate bipolar transistor (IGBT). It is envisaged that, in other embodiments of the invention, each IGBT may be replaced by a gate turn-off thyristor, a field effect transistor, an injection-enhanced gate transistor, an integrated gate commutated thyristor or any other self-commutated switching device. The number of active switching devices in each switching element may vary depending on the required voltage rating of that switching element 26.

Each passive current check element includes a passive current check device in the form of a diode. It is envisaged that, in other embodiments, each diode may be replaced by any other device that is capable of limiting current flow in only one direction. The number of passive current check devices in each passive current check element may vary depending on the required voltage rating of that passive current check element.

Each phase of the AC electrical network is connected to the PCC via a first transmission link. The PCC is connected to a primary side of the transformer via a second transmission link.

The first electrical terminals 25 of the converter 20 are connected to a secondary side of the transformer via a third transmission link. In this manner the first electrical terminals of the converter 20 are respectively connected to a respective phase of the AC electrical network.

The second electrical terminals of each converter 20 are connected to a DC electrical network carrying a DC voltage of Vdc.

Figure 2A:
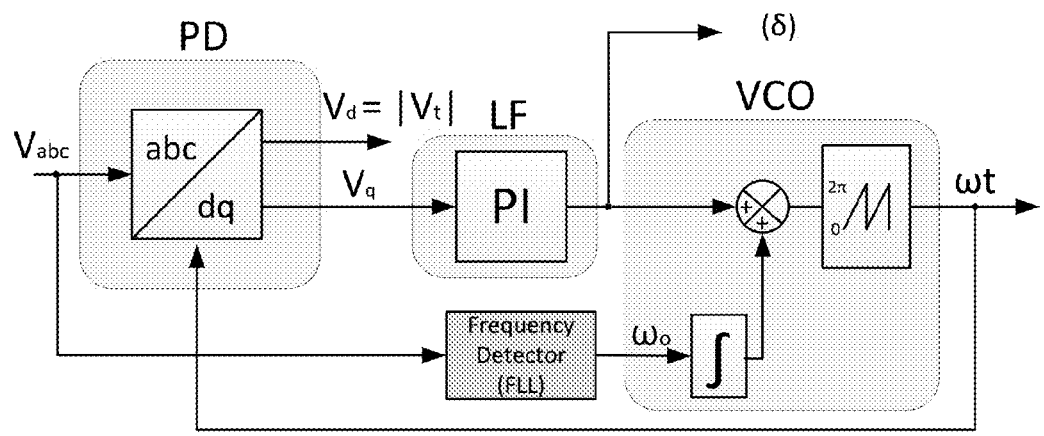
FIGS. 2A and 2B shows, in schematic form, a processing circuit of the power transmission network of FIG. 1.
Figure 2B:
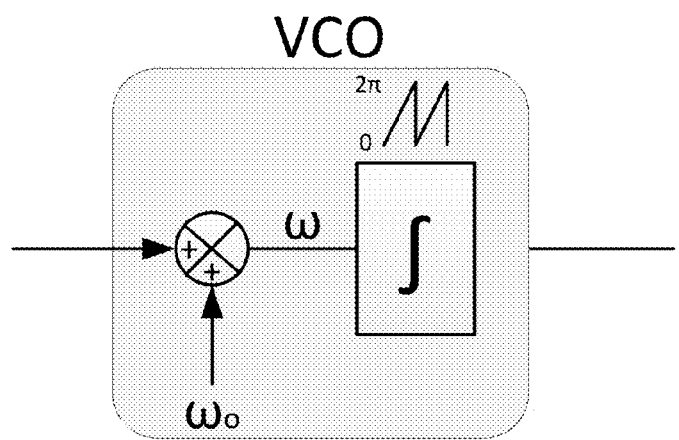

The first power transmission network further includes a processing circuit, as shown in FIGS. 2A and 2B.

The processing circuit includes a phase locked loop. The phase locked loop includes a cascade connection of a phase detector, a loop filter and a first voltage controlled oscillator. More particularly, an output of the phase detector is in communication with an input of the loop filter, an output of the loop filter is in communication to an input of the first voltage controlled oscillator, and an output of the first voltage controlled oscillator is in communication with an input of the phase detector to form a closed loop.

The phase detector is configured to receive the voltage Vabc of the PCC and to perform a stationary a-b-c reference frame to a synchronously rotating d-q reference frame transformation of the received voltage of the PCC to provide a voltage vector consisting of synchronously rotating direct and quadrature components Vd, Vq.

The loop filter is configured to provide a low-pass filtering characteristic to attenuate high-frequency AC components in the synchronously rotating quadrature component Vq of the voltage vector to provide a phase difference signal. In the embodiment shown, the loop filter is constituted by a proportional-integral controller, but it may be replaced by a first-order low-pass filter in other embodiments.

The first voltage controlled oscillator is configured to receive the phase difference signal and to generate an output AC signal as a function of the received phase difference signal. More particularly, the phase difference signal is added to an integral of a frequency reference ω0 and then processed to reset the phase angle whenever it reaches 2π rad and to keep it between 0 to 2π rad (i.e. 0 to 360°). The output AC signal is fed back to the phase detector.

The processing circuit further includes a frequency detector configured to receive and process the voltage Vabc of the PCC to provide the frequency reference ω0 to the voltage controlled oscillator. In the embodiment shown, the frequency detector is a frequency locked loop. The frequency detector is further configured to selectively clamp the frequency reference ω0 to correspond to a nominal frequency of the AC electrical network.

Figure 2C:
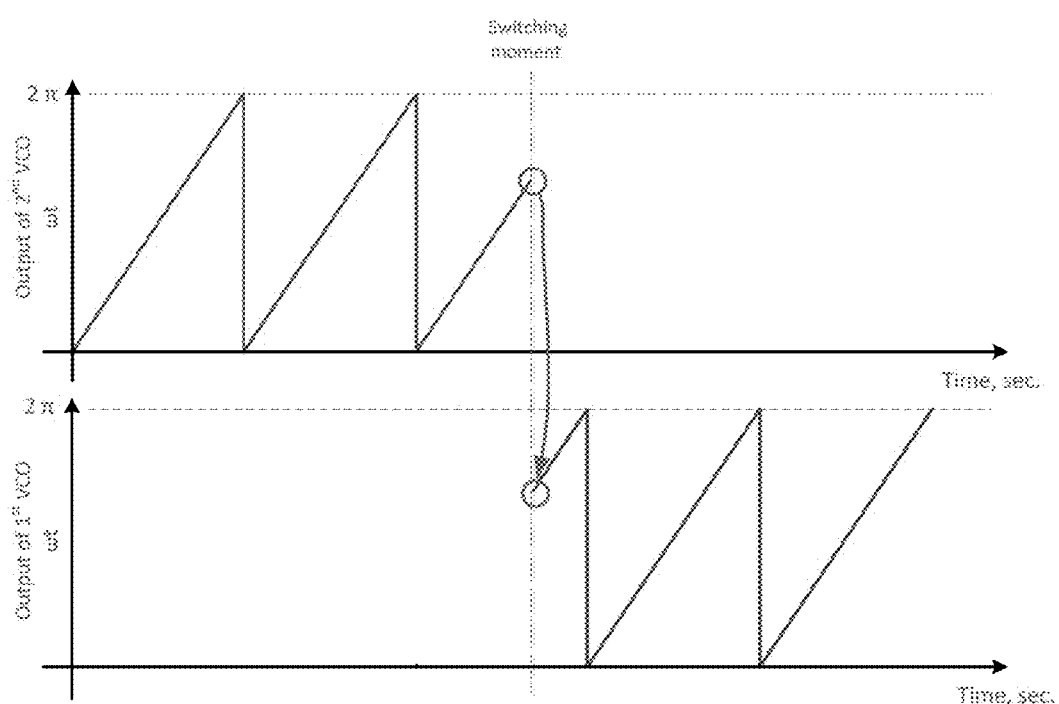
FIG. 2C illustrates the operation of the processing circuit of FIGS. 2A and 2B to switch between different voltage controlled oscillators.

The phase locked loop further includes a second voltage controlled oscillator. The phase locked loop is configured to switch between the first and second voltage controlled oscillators, as illustrated in FIG. 2C. As such only one of the first and second voltage controlled oscillators is switched into the phase locked loop at any one time.

When the second voltage controlled oscillator is switched into the phase locked loop to replace the first voltage controlled oscillator, the output of the loop filter is in communication with an input of the second voltage controlled oscillator, and an output of the second voltage controlled oscillator is in communication with the input of the phase detector to form a closed loop.

The second voltage controlled oscillator is configured to receive the phase difference signal and to generate an output AC signal as a function of the received phase difference signal. More particularly, the phase difference signal is added to the frequency reference ω0 and then processed by an integral block to provide the output AC signal ωt. The output of the integral block is kept between 0 to 2π rad (i.e. 0 to 360°), and will reset to 0 whenever it reaches 2π. The output AC signal is fed back to the phase detector.

Operation of the first power transmission network is described as follows, with reference to FIGS. 2C to 10.

The AC electrical network may include one or more sources, one or more loads and one or more power transmission lines. Thus, the network impedance of the AC electrical network not only may be difficult to determine when the AC electrical network has a complex structure, but also could vary as a result of the interaction(s) between its various components. This in turn could make it difficult to operate the converter 20 in a manner that ensures reliable and stable operation of the first power transmission network.

Figure 3:
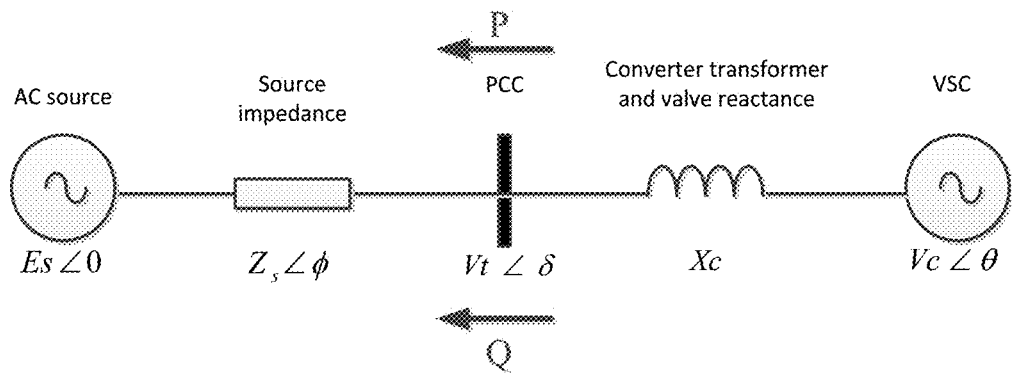
FIG. 3 shows, in schematic form, an equivalent representation of the AC side of the power transmission network of FIG. 1.

FIG. 3 shows an equivalent representation of the AC side of the first power transmission network of FIG. 1A. The AC electrical network is represented as a first voltage source with a voltage of Es, and its network impedance is represented as a simple equivalent impedance Zs. The converter 20 is represented as a second voltage source with a fundamental frequency phasor Vc. The amplitude and phase angle of the output AC voltage at each first electrical terminal of the second voltage source is assumed to be controllable through any AC voltage control method, such as power synchronisation control (PSC) or vector current control (VCC). The transformer is modelled using its leakage inductance Xc.

The stiffness of the AC electrical network is given by its short circuit ratio (SCR), which is calculated as follows:

$$SCR = \frac{V_t^2}{|Z_s| \cdot P_{rated}}$$

where Vt is the voltage of the PCC; and $P_{rated}$ is the nominal power rating of the first power transmission network.

The fundamental apparent power in each first electrical terminal of the converter 20 is given by:

$$S = P + jQ = \overline{E}_s \cdot \overline{I}$$

where S is the fundamental apparent power [VA] exchanged between the converter 20 and the AC electrical network; P is the real power [W] exchanged between the converter 20 and the AC electrical network; Q is the reactive power [VAR] exchanged between the converter 20 and the AC electrical network; $\overline{E}_s$ is the voltage of the AC electrical network; and $\overline{I}$ is the current flowing between the converter 20 and the AC electrical network.

The real power P and reactive power Q exchanged between the PCC and the AC electrical network are expressed as follows:

$$P = \frac{V_t \cdot E_S}{Z_s} \sin(\delta)$$

$$Q = \frac{V_t^2 - V_t \cdot E_s \cos(\delta)}{Z_s}$$

where δ is the phase difference between the voltages of the AC electrical network and the PCC.

It can be seen from the above equations that the values of Vt, Es and δ can be used to control both of the real power P and reactive power Q exchanged between the PCC and the AC electrical network. In addition it can be seen that the maximum power transfer for a given network impedance Zs is when the phase difference δ equals 90 electrical degrees (or 1.57 rad). In practice, the phase difference δ is likely to be less than 90 electrical degrees. If the phase difference δ exceeds 90 electrical degrees (or 1.57 rad), power transmission in the first power transmission network will decrease and could lead to a collapse in power transfer.

Prior to the exchange of power between the AC electrical network and the PCC, the second voltage controlled oscillator is switched into the phase locked loop, and the first voltage controlled oscillator is switched out of the phase locked loop. Thereafter, the second voltage controlled oscillator is configured to lock the phases of the voltages of the AC electrical network and the PCC. At this time the voltages of the AC electrical network and the PCC are in-phase (as shown in FIG. 4A), the output of the loop filter is equal to zero in steady-state conditions (i.e. the phase difference between the voltages of the AC electrical network and the PCC is equal to zero) and the output ωt of the second voltage controlled oscillator is equal to ω0t.

When real power is exchanged between the AC electrical network and the PCC, current begins to flow in the network impedance. At this stage the first voltage controlled oscillator (as shown in FIG. 2A) is switched into the phase locked loop, and the second voltage controlled oscillator (as shown in FIG. 2B) is switched out of the phase locked loop. The output of the second voltage controlled oscillator is utilised as an initial value for the first voltage controlled oscillator, as shown in FIG. 2C. This allows the first voltage controlled oscillator to utilise the initial zero phase difference present prior to the exchange of power between the AC electrical network and the PCC.

Figures 4A, 4B:
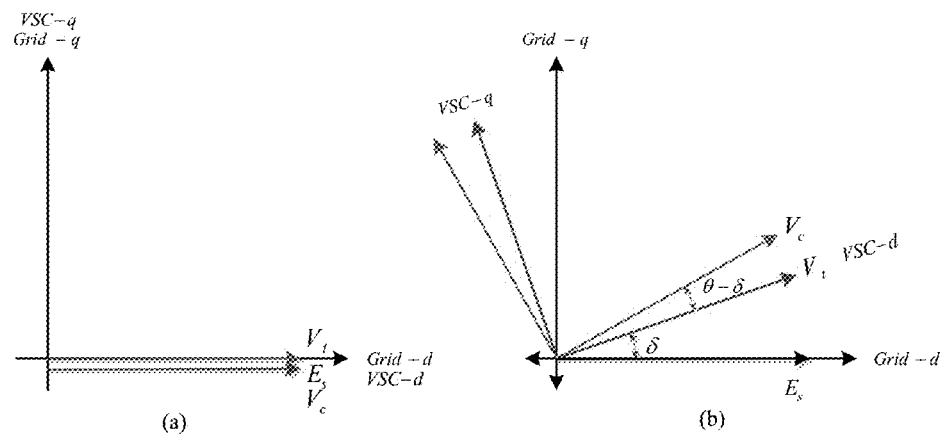
FIGS. 4A and 4B illustrate, in graph form, vector diagrams of the voltages of the AC electrical network, point of common coupling and converter of the power transmission network of FIG. 1.

Once the current begins to flow in the network impedance, the first voltage controlled oscillator adjust the rotational speed of the d-q reference frame, as shown in FIG. 4B, such that the synchronously rotating quadrature component Vq of the voltage vector is forced to zero and $\omega t$ is equal to $\omega 0t+\delta$. At this time the output of the loop filter is equal to a non-zero value (i.e. the phase difference between the voltages of the AC electrical network and the PCC is a non-zero value). In this manner the output of the loop filter is configured to provide a phase difference signal corresponding to the phase difference between the voltages of the AC electrical network and the PCC.

As such the phase locked loop of the processing circuit is capable of receiving and processing the voltage of the PCC to determine the phase difference between the voltages of the AC electrical network and the PCC.

Using the above equations, the processing circuit processes the phase difference in combination with the voltage and current of the PCC to determine the value of the network impedance of the AC electrical network. In determining the value of the network impedance of the AC electrical network, the voltages of the AC electrical network and the PCC are assumed to be the same since the resistance of the network impedance is very low.

Thereafter, the processing circuit processes the network impedance to define the operating requirements of the converter 20, and to operate the converter 20 in accordance with the defined operating requirements. For example, the processing circuit may process the network impedance to define the real and/or reactive power exchange requirements of the exchange of power between the AC electrical network and the converter 20, and to operate the converter 20 in accordance with the defined real and/or reactive power exchange requirements. The configuration of the processing circuit to define the reactive power exchange requirements of the exchange of power between the AC electrical network and the converter 20 is particularly useful when the AC electrical network is a weak AC electrical network.

During the exchange of power between the AC electrical network and the PCC, the frequency detector clamp the frequency reference $\omega 0$ to correspond to a nominal frequency of the AC electrical network. The provision of the frequency reference to the first voltage controlled oscillator eliminates any error in the determined phase difference that would have been caused by a shift in frequency of the AC electrical network, thus improving the accuracy of the determined phase difference.

FIGS. 5 to 10 illustrate, in graph form, an exemplary operation of the first power transmission network.

Figure 5:
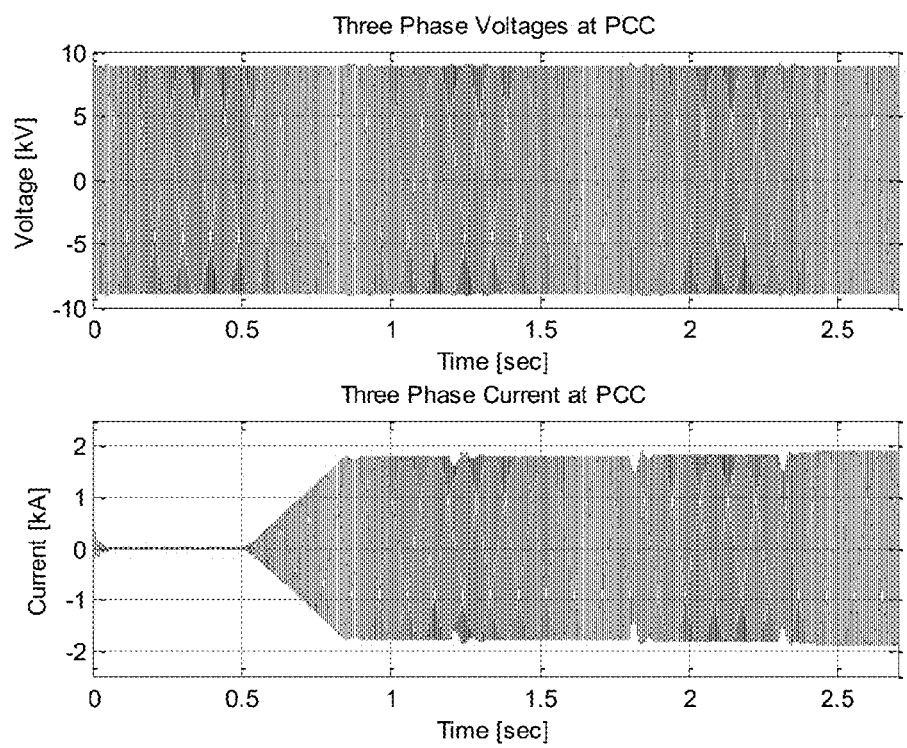
FIGS. 5, 6, 7, 8, 9, and 10 illustrate, in graph form, an exemplary operation of the power transmission network of FIG. 1A.

In this exemplary operation, the DC power of the first power transmission network is ramped up at t=0.5 s from zero towards a rated power of 24 MW (1.0 per unit). Meanwhile the converter 20 is controlled to maintain a constant AC voltage at each of its first electrical terminals, as shown in FIG. 5.

Figure 6:
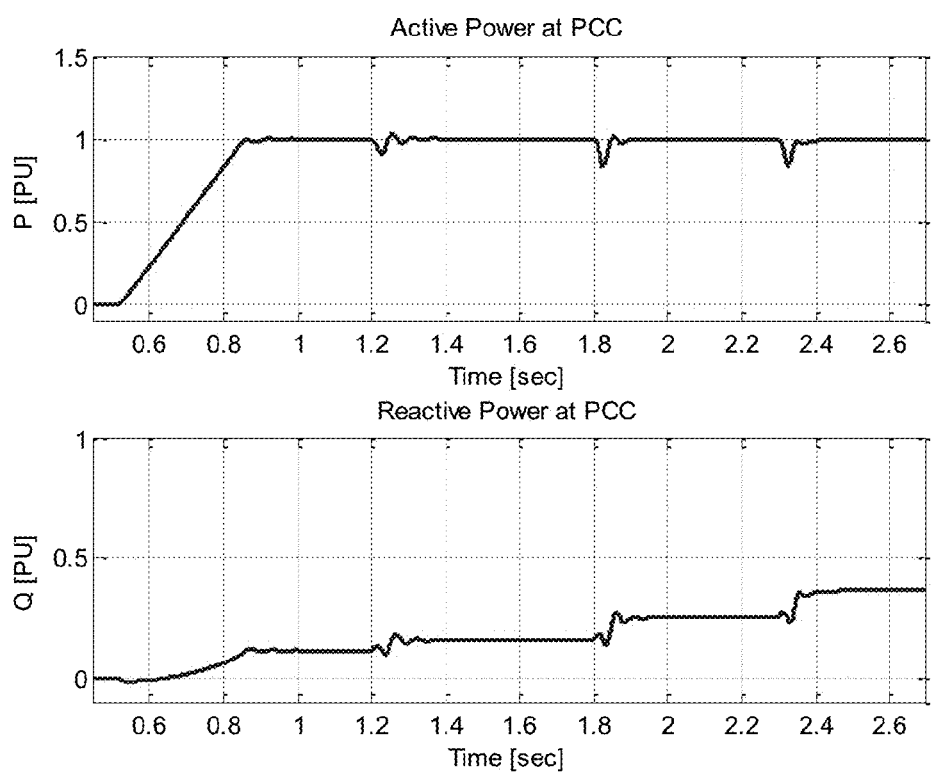
Figure 7:
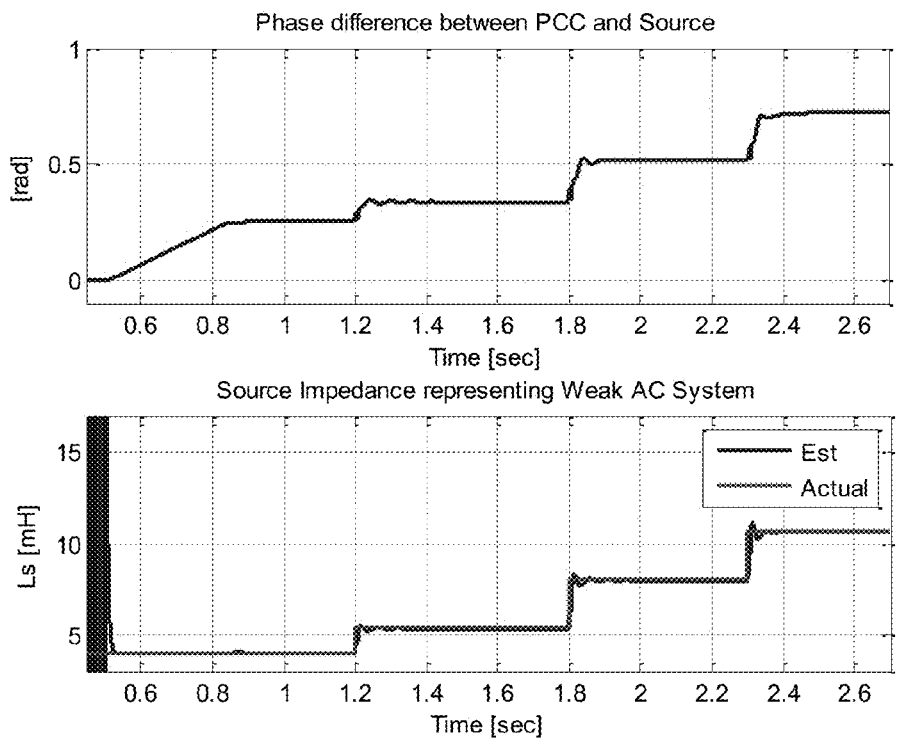
Figure 8:
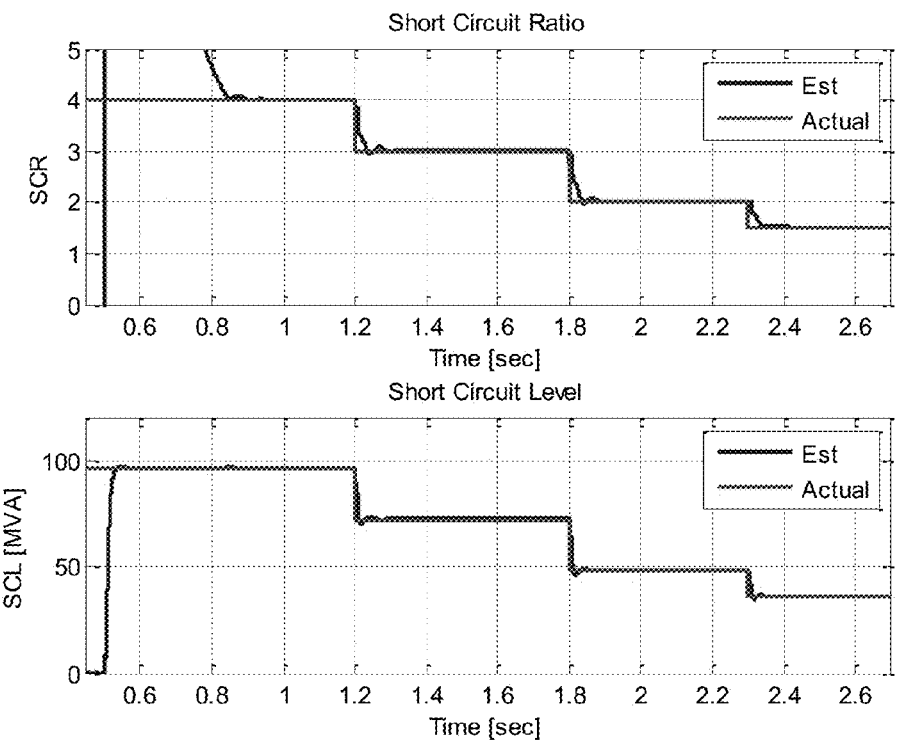
Figure 9:
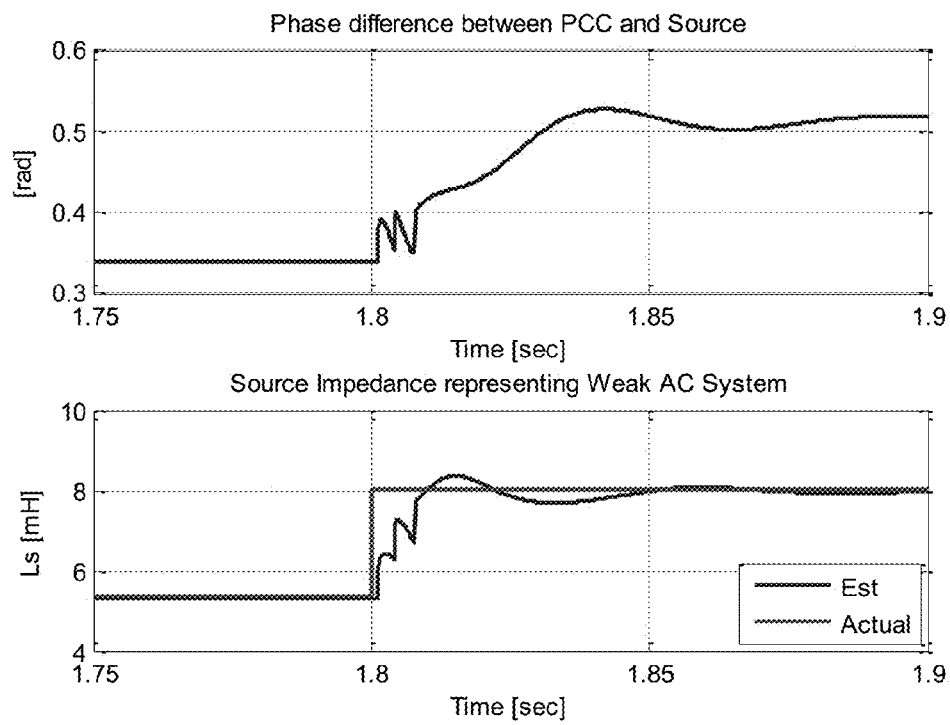
Figure 10:
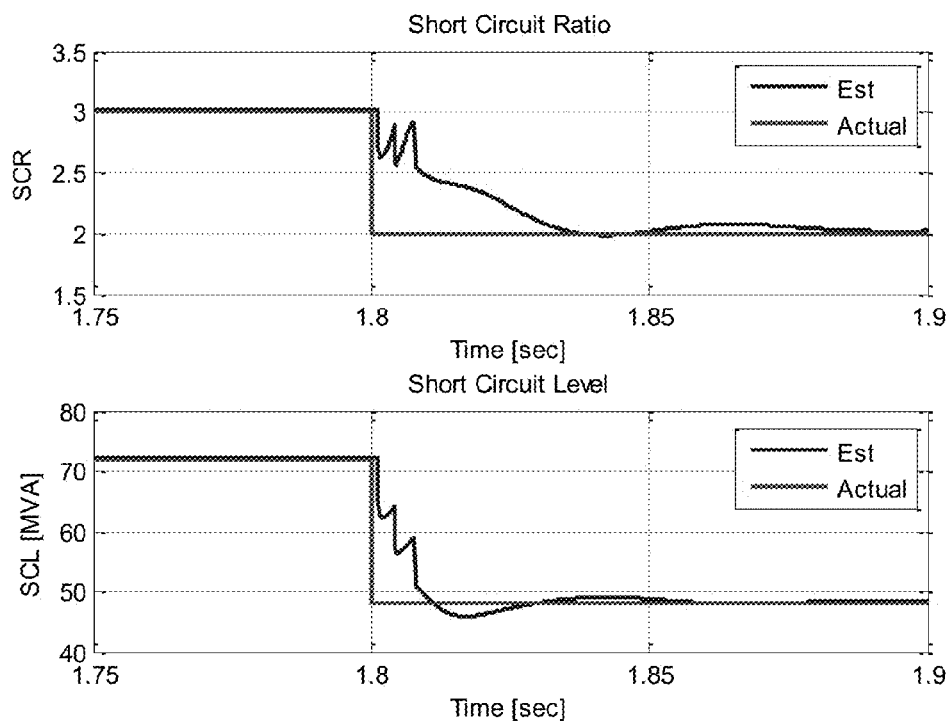

From t=0 s to t=1.2 s, the network impedance has a SCR of 4. Thereafter, the SCR of the network impedance is changed to 3 at t=1.2 s, to 2 at t=1.8 s and to 1.5 at t=2.3 s to simulate a variation in the network impedance, as shown in FIG. 8. The change in SCR corresponds to a change in network impedance of the AC electrical network, as shown in FIG. 7, and so results in a change in phase difference between the voltages of the AC electrical network and the PCC. FIG. 6 shows the corresponding changes in real and reactive power exchanged between the AC electrical network and the PCC.

It can be seen from FIG. 8 that the processing circuit is capable of accurately determining the network impedance, and therefore the SCR, of the AC electrical network with an error of less than 1%. In addition it can be seen from FIGS. 9 and 10 that, after the change in SCR of the network impedance, the processing circuit is capable of rapidly determining the network impedance, and therefore the SCR, of the AC electrical network within less than half a cycle (0.01 s).

The configuration of the processing circuit, as shown in FIGS. 2A and 2B, therefore permits determination of the phase difference, and subsequently use of the phase difference to accurately determine the network impedance of the AC electrical network during the exchange of power between the AC electrical network and the point of common coupling. Furthermore such configuration of the processing circuit permits operation of the converter 20 to be adapted to take into account any variation in the network impedance in order to ensure reliable and stable operation of the first power transmission network. Otherwise not adapting the operation of the converter 20 to take into account any variation in the network impedance could lead to undesirable consequences, such as the occurrence of an undesirable transient overcurrent or a collapse in power transfer between the AC electrical network and the DC electrical network.

In addition the use of the phase locked loop permits continuous and real-time determination of the phase difference between the voltages of the AC electrical network and the PCC during the exchange of power between the AC electrical network and the PCC. This ensures that the first power transmission network may be operated in a reliable and stable manner when the phase difference varies greatly with time.

There is provided a second power transmission network according to a second embodiment of the invention. The second power transmission network is similar in structure and operation to the first power transmission network of FIG. 1, and like features share the same reference numerals.

The second power transmission network differs from the first power transmission network in that, in the second power transmission network the phase detector is configured to perform a stationary a-b-c reference frame to a synchronously rotating d-q reference frame transformation of the received voltage of the point of common coupling to provide a voltage vector consisting of positive and negative sequence components. Additionally, in the second power transmission network the loop filter is configured to receive and process only the positive sequence component of the positive and negative sequence components of the voltage vector.

Configuration of the phase detector and loop filter in this manner enables determination of the phase difference during unbalanced operating conditions of the second power transmission network. This is because the oscillating component associated with the negative sequence component is omitted when determining the phase difference.

FIGS. 12 to 16 illustrate, in graph form, an exemplary operation of the second power transmission network.

Figure 12:
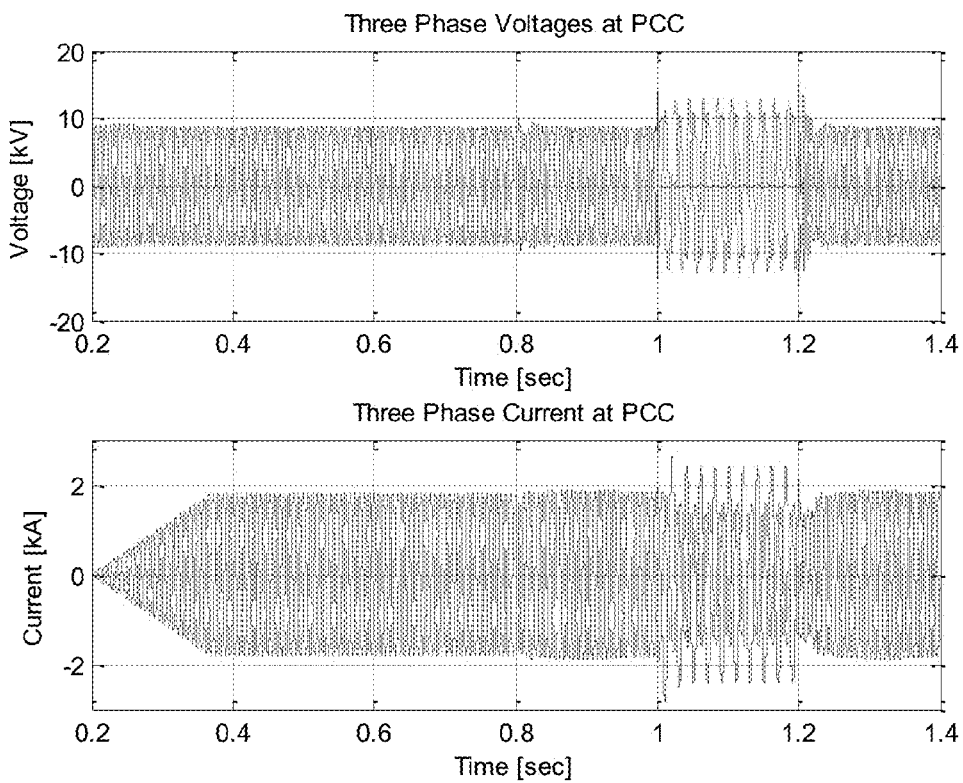
FIGS. 12, 13, 14, 15, and 16 illustrate, in graph form, an exemplary operation of the power transmission network according to the second embodiment of the invention.

In this exemplary operation, the DC power of the first power transmission network is ramped up at t=0.2 s from zero towards a rated power of 24 MW (1.0 per unit). Meanwhile the converter 20 is controlled to maintain a constant AC voltage at each of its first electrical terminals, as shown in FIG. 12.

Figure 13:
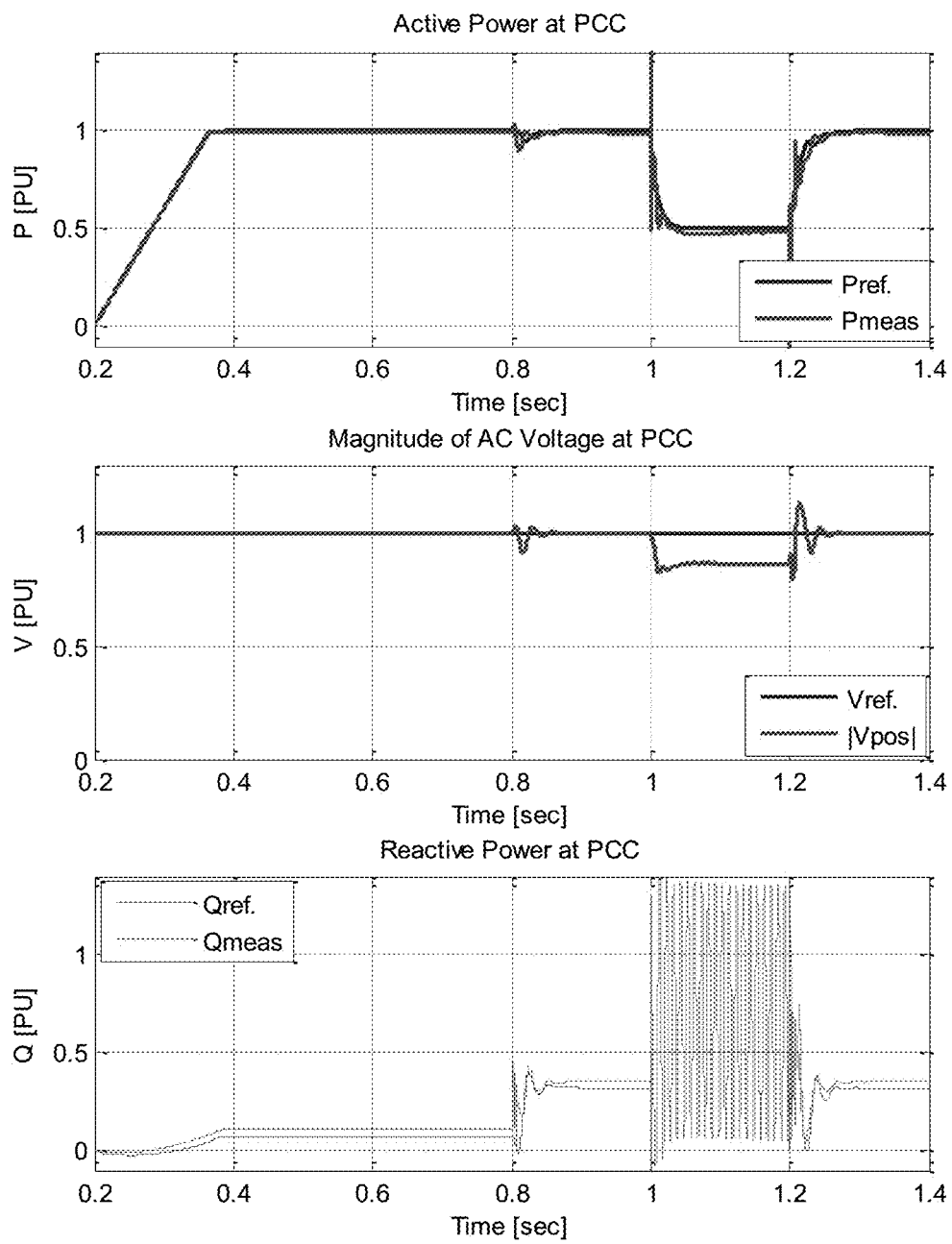
Figure 14:
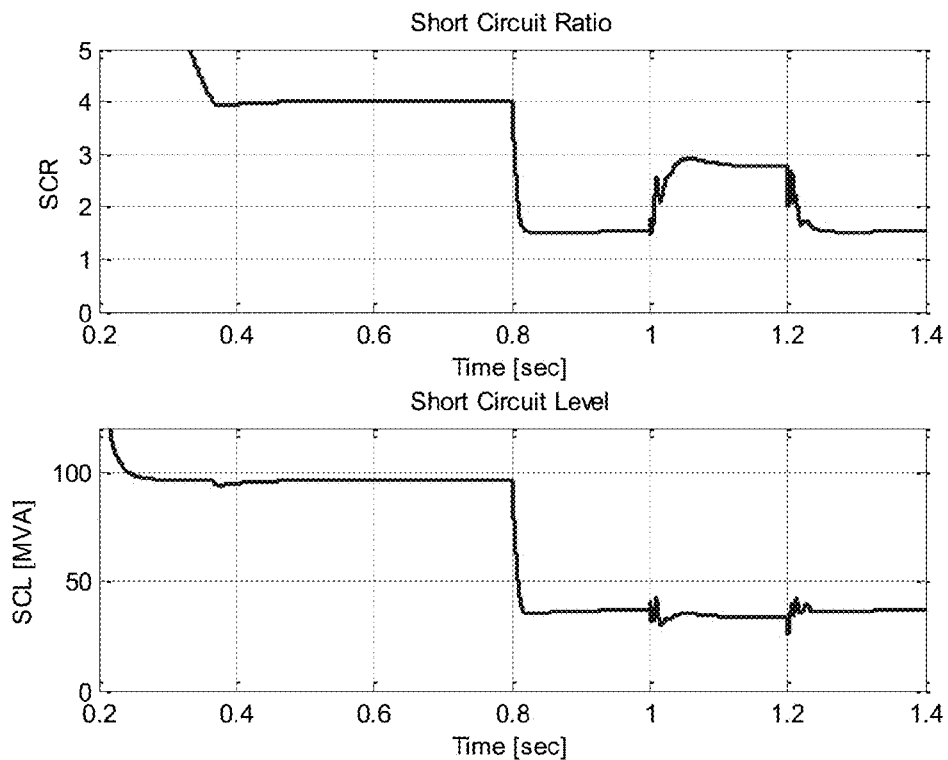
Figure 15:
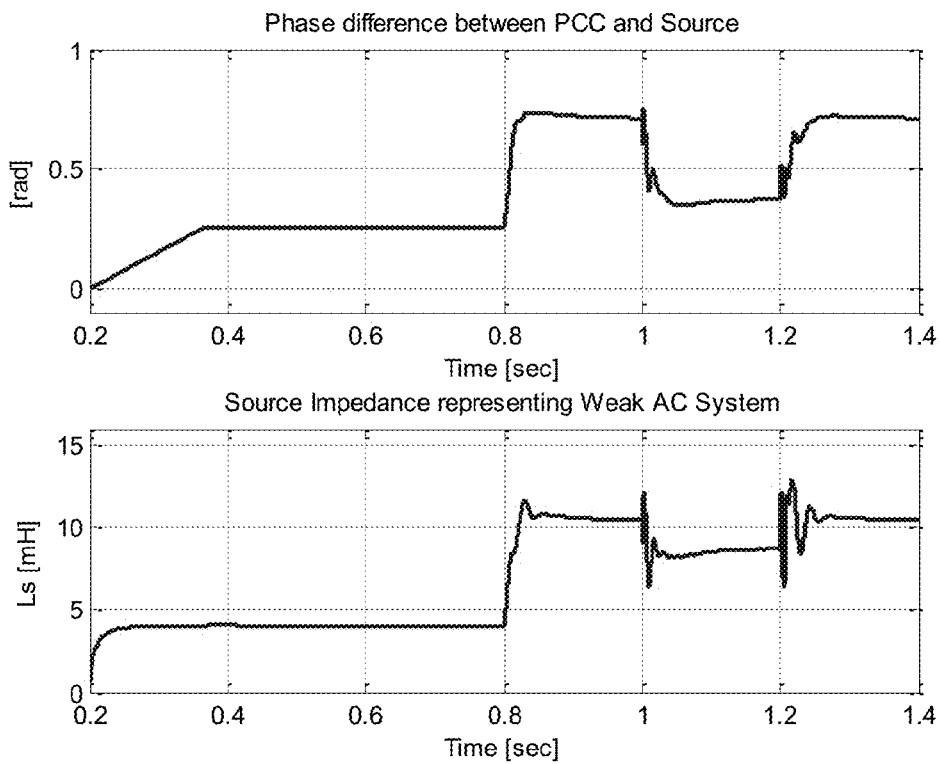

From t=0 s to t=0.8 s, the network impedance has a SCR of 4. Thereafter, the SCR of the network impedance is changed to 1.5 at t=0.8 s to simulate a variation in the network impedance, as shown in FIG. 14. The change in SCR corresponds to a change in network impedance of the AC electrical network, as shown in FIG. 15, and so results in a change in phase difference between the voltages of the AC electrical network and the PCC. FIG. 13 shows the corresponding changes in real and reactive power exchanged between the AC electrical network and the PCC.

It can be seen from FIG. 14 that the processing circuit is capable of accurately determining the network impedance, and therefore the SCR, of the AC electrical network with an error of less than 1%. In addition it can be seen from FIG. 15 that, after the change in SCR of the network impedance, the processing circuit is capable of rapidly determining the network impedance, and therefore the SCR, of the AC electrical network.

At t=1 s, a single phase-to-ground fault is applied to one of the phases of the AC electrical network to simulate unbalanced operating conditions of the second power transmission network. In response the converter control reduces its power reference to handle the unbalanced operating conditions. It can be seen from the top graph of FIG. 14 that the SCR of the network impedance is increased, as illustrated by the corresponding reduction in real power to approximately 0.5 per unit in the top graph of FIG. 13

Figure 11:
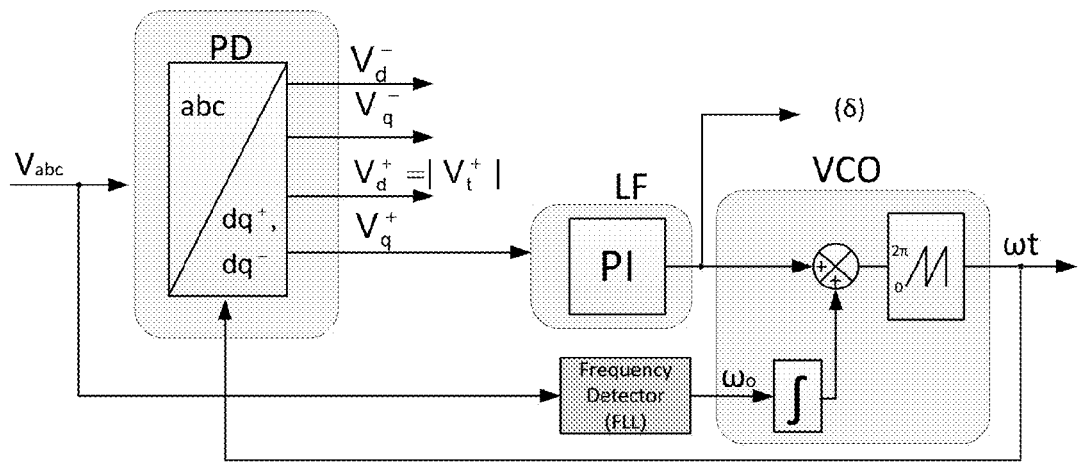
FIG. 11 shows, in schematic form, a processing circuit of a power transmission network according to a second embodiment of the invention.
Figure 16:
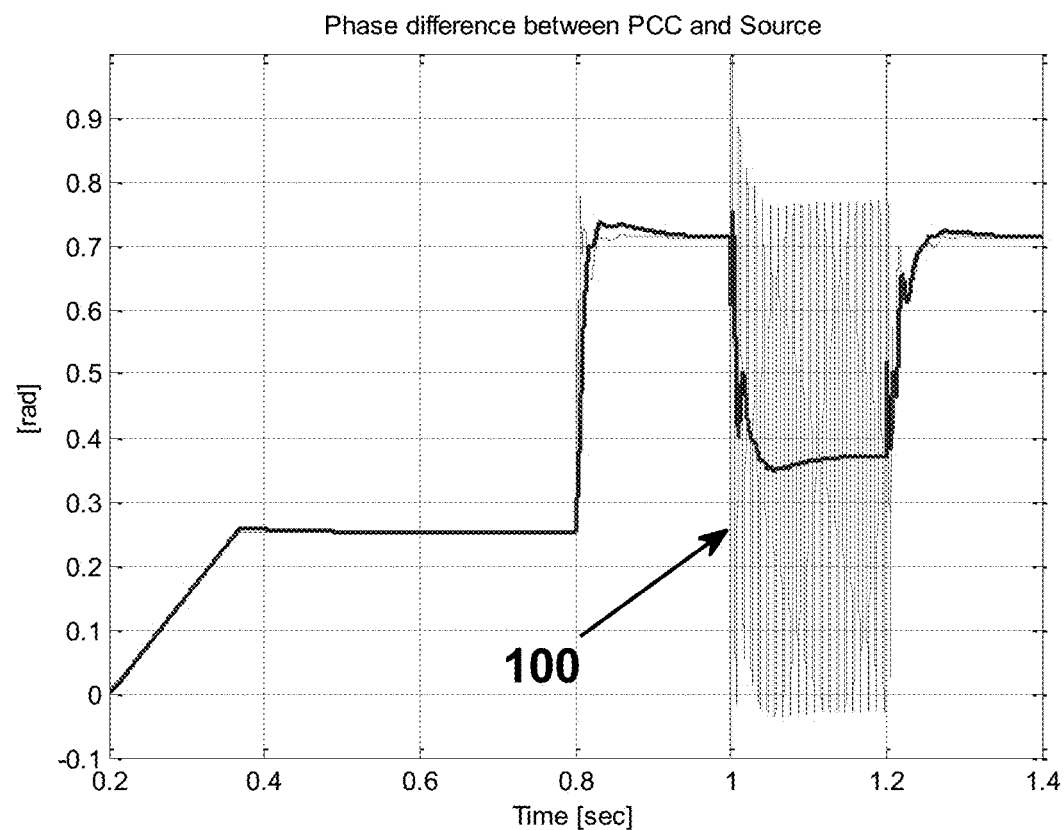

It can be seen from FIG. 16 that the processing circuit of the second power transmission network is capable of accurate and rapid determination of the phase difference during both balanced and unbalanced operating conditions of the second power transmission network, when compared to the processing circuit of the first power transmission network. This is illustrated by the presence of an oscillating component 100 that is caused by the existence of a negative sequence component when the processing circuit of the first power transmission network is used. As mentioned above and as shown in FIG. 11, the processing circuit of the second power transmission network eliminates the oscillating component by only allowing the positive sequence component of the quadrature voltage (Vq+) to be passed to the loop filter.

It will be appreciated that the properties of the converter and the power transmission network are merely chosen to help illustrate the operation of the invention, and may vary depending on the requirements of the associated power application.

It will be further appreciated that the topologies of the converter and the power transmission network are merely chosen to help illustrate the operation of the invention, and that the converter and the power transmission network may be respectively replaced by another converter with a different topology and by another power transmission network with a different topology.

In other embodiments of the invention it is envisaged that, instead of having three phases, the AC electrical network may have a single phase or a different plurality of phases. Accordingly the number of converter limbs in the converter may vary to correspond to the number of phases of the AC electrical network.

It is to be understood that even though numerous characteristics and advantages of various embodiments have been set forth in the foregoing description, together with details of the structure and functions of various embodiments, this disclosure is illustrative only, and changes may be made in detail, especially in matters of structure and arrangement of parts within the principles of the embodiments to the full extent indicated by the broad general meaning of the terms in which the appended claims are expressed. It will be appreciated by those skilled in the art that the teachings disclosed herein can be applied to other systems without departing from the scope and spirit of the application.

What is claimed is:

1. A power transmission network comprising:
    an AC electrical network connected to a point of common coupling, the AC electrical network having a voltage, the point of common coupling being connectable to a further electrical device; and
    a processing circuit comprising a phase locked loop, the processing circuit configured to receive and process a voltage of the point of common coupling to determine a phase difference between the voltages of the AC electrical network and the point of common coupling during an exchange of power between the AC electrical network and the point of common coupling, the phase locked loop comprising:
    a phase detector,
    a loop filter, an output of the loop filter being configured to provide a phase difference signal corresponding to the phase difference;
    a first voltage controlled oscillator; and
    a second voltage controlled oscillator configured to lock the phases of the voltages of the AC electrical network and the point of common coupling prior to the exchange of power between the AC electrical network and the point of common coupling;
    wherein the phase locked loop is configured to switch between the first voltage controlled oscillator and second voltage controlled oscillator.

2. A power transmission network according to claim 1, wherein the voltages of the AC electrical network and the point of common coupling are in-phase prior to the exchange of power between the AC electrical network and the point of common coupling.

3. A power transmission network according to claim 1, wherein the point of common coupling is connected to a converter.

4. A power transmission network according to claim 3, wherein the processing circuit is configured to process the phase difference in combination with the voltage and current of the point of common coupling to determine a network impedance of the AC electrical network, to process the network impedance to define the operating requirements of the converter, and to operate the converter in accordance with the defined operating requirements.

5. A power transmission network according to claim 4, wherein the processing circuit is configured to process the network impedance to define the real and/or reactive power exchange requirements of the exchange of power between the AC electrical network and the converter, and to operate the converter in accordance with the defined real and/or reactive power exchange requirements.

6. A power transmission network according to claim 1, wherein the processing circuit further includes a frequency detector configured to receive and process a voltage of the point of common coupling to provide a frequency reference to at least one of the first voltage controlled oscillator and second voltage controlled oscillator.

7. A power transmission network according to claim 6, wherein the frequency detector is or includes a frequency locked loop.

8. A power transmission network according to claim 6, wherein the frequency detector is configured to clamp the frequency reference to correspond to a nominal frequency of the AC electrical network during the exchange of power between the AC electrical network and the point of common coupling.

9. A power transmission network according to claim 1, wherein the phase detector is configured to perform a transformation of the received voltage of the point of common coupling to provide a voltage vector consisting of positive and negative sequence components.

10. A power transmission network according to claim 9, wherein the loop filter is configured to receive and process only the positive sequence component of the positive and negative sequence components of the voltage vector to determine the phase difference between the voltages of the AC electrical network and the point of common coupling during an exchange of power between the AC electrical network and the point of common coupling.

11. A power transmission network according to claim 1, wherein the processing circuit further includes a frequency detector configured to receive and process a voltage of the point of common coupling to provide a frequency reference to at least one of the first voltage controlled oscillator and second voltage controlled oscillator.

12. A power transmission network according to claim 7, wherein the frequency detector is configured to clamp the frequency reference to correspond to a nominal frequency of the AC electrical network during the exchange of power between the AC electrical network and the point of common coupling.

* * * * *